US012100935B2

(12) United States Patent
Larisch et al.

(10) Patent No.: US 12,100,935 B2
(45) Date of Patent: Sep. 24, 2024

(54) RADIATION EMITTER

(71) Applicant: Changchun Institute of Optics, fine Mechanics and Physics, Chinese Academy of Sciences, Jilin (CN)

(72) Inventors: Gunter Larisch, Neuenhagen (DE); Sicong Tian, Jilin (CN); Dieter Bimberg, Berlin (DE)

(73) Assignee: Changchun Institute of Optics, Fine Mechanics and Physics, Chinese Academy of Sciences, Changchun Jilin (CN)

( * ) Notice: Subject to any disclaimer, the term of this patent is extended or adjusted under 35 U.S.C. 154(b) by 638 days.

(21) Appl. No.: 17/170,834

(22) Filed: Feb. 8, 2021

(65) Prior Publication Data

US 2022/0059997 A1 Feb. 24, 2022

(30) Foreign Application Priority Data

Aug. 24, 2020 (EP) ..................................... 20192355

(51) Int. Cl.
*H01S 5/183* (2006.01)
*H01L 33/00* (2010.01)
(Continued)

(52) U.S. Cl.
CPC ........ *H01S 5/18327* (2013.01); *H01L 33/005* (2013.01); *H01S 5/18311* (2013.01);
(Continued)

(58) Field of Classification Search
CPC ............. H01S 5/18341; H01S 5/18347; H01S 5/18308–18338
See application file for complete search history.

(56) References Cited

U.S. PATENT DOCUMENTS 5,729,566 A * 3/1998 Jewell ................. H01S 5/18341
257/97
5,978,408 A 11/1999 Thornton
(Continued)

FOREIGN PATENT DOCUMENTS

CN 1335658 A 2/2002
CN 1845407 A 10/2006
(Continued)

OTHER PUBLICATIONS

G. Larisch et al.; "Optimization of VCSEL Photon Lifetime for Minimum Energy Consumption at Varying Bit Rates"; Optics Express 18931, Research Article; vol. 28; No. 13; Jun. 22, 2020; 7 pages.
(Continued)

*Primary Examiner* — Sean P Hagan
(74) *Attorney, Agent, or Firm* — Gordon Rees Scully & Mansukhani, LLP

(57) ABSTRACT

A method of fabricating at least one radiation emitter including fabricating a layer stack that includes a first reflector, an active region, an oxidizable layer, and a second reflector; and locally removing the layer stack, and thereby forming at least one mesa. The mesa includes the first reflector, the active region, the oxidizable layer and the second reflector. Before or after locally removing the layer stack and forming the mesa the following steps are carried out: vertically etching at least three blind holes inside the layer stack, wherein the blind holes vertically extend to and expose the oxidizable layer; and oxidizing the oxidizable layer via the sidewalls of the blind holes in lateral direction. An oxidation front radially moves outwards from each hole. The etching is terminated before the entire oxidizable layer is oxidized, thereby forming at least one unoxidized aperture that is limited by at least three oxidation fronts.

4 Claims, 5 Drawing Sheets

(51) Int. Cl.
  *H01S 5/042* (2006.01)
  *H01S 5/42* (2006.01)
(52) U.S. Cl.
  CPC ........ *H01S 5/18313* (2013.01); *H01S 5/1833* (2013.01); *H01S 5/18333* (2013.01); *H01S 5/18341* (2013.01); *H01S 5/18347* (2013.01); *H01S 5/423* (2013.01); *H01S 5/04256* (2019.08); *H01S 5/04257* (2019.08)

(56) References Cited

U.S. PATENT DOCUMENTS

| | | | |
|---|---|---|---|
| 6,687,268 B2* | 2/2004 | Kitamura | H01S 5/04257 372/22 |
| 10,243,330 B2 | 3/2019 | Ledentsov et al. | |
| 2001/0019569 A1 | 9/2001 | Jayaraman et al. | |
| 2001/0043629 A1 | 11/2001 | Sun et al. | |
| 2002/0021733 A1 | 2/2002 | Lee et al. | |
| 2003/0179800 A1 | 9/2003 | Uebbing | |
| 2003/0185267 A1 | 10/2003 | Hwang et al. | |
| 2004/0125841 A1* | 7/2004 | Takiguchi | H01S 5/18311 372/96 |
| 2004/0258121 A1 | 12/2004 | Lee et al. | |
| 2005/0019973 A1 | 1/2005 | Chua | |
| 2005/0100068 A1* | 5/2005 | Jikutani | B82Y 20/00 372/96 |
| 2005/0151137 A1 | 7/2005 | Steinle | |
| 2006/0146904 A1 | 7/2006 | Guenter et al. | |
| 2006/0227836 A1 | 10/2006 | Omori et al. | |
| 2008/0056323 A1* | 3/2008 | Yoshikawa | H01S 5/18311 438/46 |
| 2010/0215070 A1* | 8/2010 | Hattori | H01S 5/1833 372/43.01 |
| 2011/0058587 A1 | 3/2011 | Sakurai et al. | |
| 2011/0182314 A1 | 7/2011 | Yoshikawa et al. | |
| 2011/0304684 A1 | 12/2011 | Numata et al. | |
| 2013/0272330 A1 | 10/2013 | Joseph et al. | |
| 2016/0352073 A1 | 12/2016 | Dummer et al. | |
| 2017/0373471 A1* | 12/2017 | Kropp | H01S 5/305 |
| 2019/0319429 A1* | 10/2019 | Ledentsov | H01S 5/141 |
| 2020/0280175 A1 | 9/2020 | Lee | |
| 2021/0367404 A1 | 11/2021 | Kesler | |
| 2023/0116144 A1* | 4/2023 | Dai | H01S 5/04256 372/46.013 |

FOREIGN PATENT DOCUMENTS

| | | | |
|---|---|---|---|
| CN | 106887788 A | | 6/2017 |
| CN | 110416874 A | | 11/2019 |
| CN | 112 382 927 A | | 2/2021 |
| EP | 1 501 162 A2 | | 1/2005 |
| EP | 1 501 162 A3 | | 12/2005 |

OTHER PUBLICATIONS

G. Larisch, et al; "910 nm Single-Mode VCSELs and its Application for Few-Mode Transmission over Graded-Index Single-Mode Fibers"; ICTON 2020; TuB3.2; 22nd International Conference on Transparent Optical Networks; 4 pages.

V. Shchukin et al.; "Single-Mode Vertical Cavity Surface Emitting Laser via Oxide-Aperture-Engineering of Leakage of High-Order Transverse Modes"; IEEE Journal of Quantum Electronics; vol. 50; No. 12; Dec. 2014; pp. 990-995.

G. Larisch, et al.; "Energy-efficient 50+ Gbit/s VCSELs for 200+ Gbit/s Optical Interconnects"; IEEE Journal of Selected Topics in Quantum Electronics; (2019); 6 pages.

First Office dated Apr. 13, 2022 issued in related Chinese Patent Application No. 202110848970.7.

Second Office dated Apr. 24, 2022 issued in related Chinese Patent Application No. 202110432333.1.

European Search Report dated Feb. 12, 2021 issued by the European Patent Office in related European Patent Application No. 20 192 355.4.

Extended European Search Report dated Sep. 2, 2021 issued by the European Patent Office in related European Patent Application No. 21 16 8265.

Extended European Search Report dated May 26, 2021 issued by the European Patent Office in related European Patent Application No. 20 21 0737.

\* cited by examiner

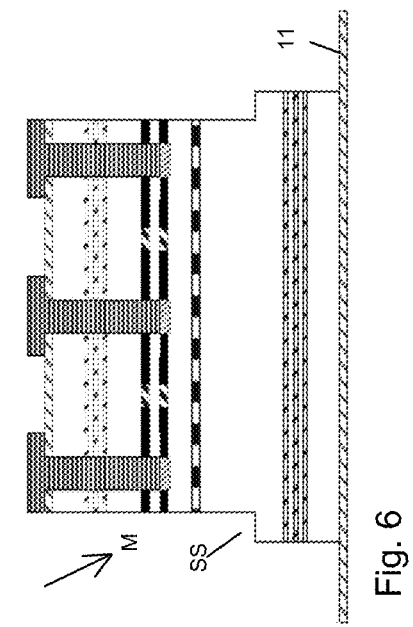
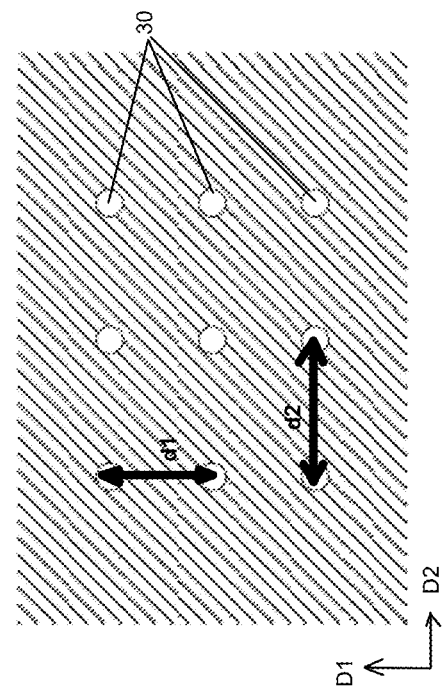
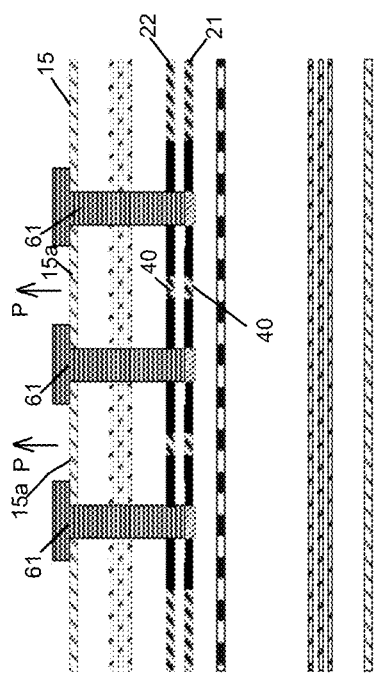
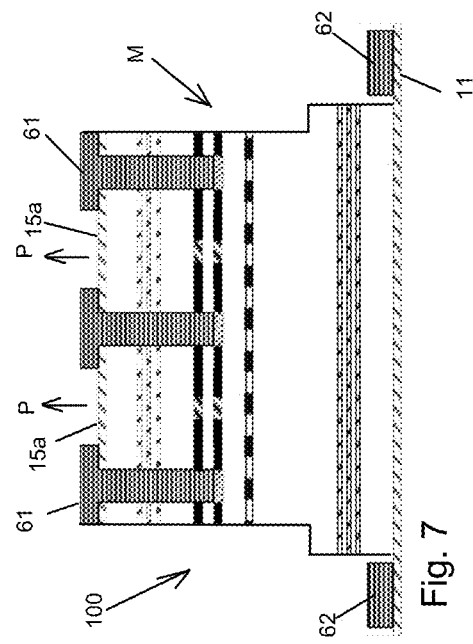

RADIATION EMITTER

CROSS REFERENCE TO RELATED APPLICATION

The present application claims the benefit of and priority to European Patent Application EP20192355 filed on Aug. 24, 2020. The foregoing application is incorporated by reference herein in its entirety.

BACKGROUND OF THE INVENTION

The energy required to transmit information as optical data bits within and between electronic and photonic integrated circuits, within and between computer servers, within and between data centers, and ultimately across the earth from one point to another spans from typically tens of picojoules-per-bit to well over tens of millijoules-per-bit for intercontinental distances. Internet use increases by 60%/year and larger and larger data centers (in size and energy consumption) with millions of optical interconnects are presently built. To keep up with the demand in communication capacity, data transmission across longer and longer distances using high power single mode emitters combined with dense wavelength multiplexing must be enabled.

Key enabling emitters for short distances up to 1-2 km are high power single mode vertical-cavity surface-emitting lasers (VCSELs).

VCSELs can be easily designed to emit at a variety of wavelengths across present multi- and single-mode optical cables for such short distances. Wavelength division multiplexing, WDM, increases enormously the bitrate per link. Optimized combination of the number of channels and the bit rate reduces the energy consumption and operating cost of the network as shown by Larisch et al. (G. Larisch, S. Tian, and D. Bimberg, "Optimization of VCSEL photon lifetime for minimum energy consumption at varying bit rates," *Opt. Express*, vol. 28, p. 6, 2020). The IEEE 802.3cd standard defines a 30 nm spacing between "channels", a number adapted to properties of typical multimode VCSELs. A further enormous increase of bandwidth per link, necessary to catch-up with demand, in line with additional reduction of energy consumption can be achieved by further reducing the spacing between the wavelengths. Narrow emission spectra are necessary to avoid cross talk between the channels. A further advantage of such spectra is the reduction of dispersion, supporting additionally increases of the transmission distances, as discussed in the publication by Larisch et al. (G. Larisch, A. A. Juarez, X. Chen, K. Li, D. Bimberg, and M.-J. Li, "910 nm Single-Mode VCSELs and its Application for Few-Mode Transmission over Graded-Index Single-Mode Fibers (Invited)," in 2020 *22nd International Conference on Transparent Optical Networks (ICTON)*).

Spectrally narrow emission is achieved today in particular by suppressing higher order modes of the laser. Higher order modes can be avoided by reduction of the size of the active area, leading to an increase of the D-factor:

$$f_R = D\sqrt{I - I_{th}}$$

With relaxation resonance frequency fR, current I and threshold current Ith.

$$D = \frac{1}{2\pi}\sqrt{\frac{n_i \Gamma v_g}{q} \cdot \frac{g'}{V_a}}$$

With g' differential gain, Va active volume, ηi internal quantum efficiency, vg group velocity, Γ confinement-Factor.

The size of the active area of a VCSEL depends on its cavity length and its aperture diameter. Today's datacom VCSELs usually have a cavity lengths of lambda half. A further reduction is not possible. A reduction of aperture diameter leads to several drawbacks. The resistance and the differential resistance increase, and the output power drops. A low electrical resistance eases however impedance match of laser and driver, and reduces the total energy consumption of present driver designs.

Objective of the Present Invention

In view of the above, an objective of the present invention is to propose radiation emitters that may provide large output powers with relatively small aperture diameters.

A further objective of the present invention is to provide a method for fabricating radiation emitters that provide large output powers with relatively small aperture diameters.

BRIEF SUMMARY OF THE INVENTION

An exemplary embodiment of the present invention relates to a method of fabricating at least one radiation emitter comprising the steps of
- fabricating a layer stack that comprises a first reflector, an active region, an oxidizable layer, and a second reflector; and
- locally removing the layer stack, and thereby forming at least one mesa, wherein the at least one mesa comprises the first reflector, the active region, the oxidizable layer and the second reflector, characterized in that before or after locally removing the layer stack and forming the at least one mesa the following steps are carried out:
- vertically etching at least three blind holes per radiation emitter inside the layer stack, wherein the blind holes vertically extend at least to the oxidizable layer and expose the oxidizable layer; and
- oxidizing the oxidizable layer via the sidewalls of the blind holes in lateral direction, wherein from each hole an oxidation front radially moves outwards and wherein the etching is terminated before the entire oxidizable layer is oxidized, thereby forming at least one unoxidized aperture that is limited by at least three oxidation fronts, per radiation emitter.

An advantage of this embodiment of the invention is that the method allows fabricating mesas which each have a plurality of relatively small apertures, in contrast to mesas of prior art VCSELS. In prior art VCSELs, apertures are formed by oxidizing oxidizable layers after the mesa is etched, i.e. by oxidizing via the sidewall of the mesa. Therefore, the prior art fabrication can provide a single aperture per mesa, only. In contrast thereto and according to the invention, the apertures are formed (either before the mesa is etched or thereafter) by etching blind holes and oxidizing oxidizable layer or layers from the inside of the holes via the holes' sidewalls. This procedure allows creating apertures which are independent from the formation of the mesa. Therefore, it is possible to fabricate a plurality of apertures within the same mesa. For example, the resulting radiation emitter may have a plurality of densely spaced apertures which each define a VCSEL sub-cell or VCSEL subunit within the same mesa. The VCSEL sub-cells may operate in parallel and allow the mesa to output larger amounts of energy than mesas with a single aperture are capable of.

Preferably, the steps of vertically etching the blind holes and oxidizing the oxidizable layer or layers via the sidewalls of the blind holes, are carried out before the mesa is etched.

The at least three blind holes per radiation emitter are preferably vertically etched inside the layer stack in an area which belongs to the at least one mesa after locally removing the layer stack.

Preferably, at least four blind holes are etched inside the layer stack in an area which will belong to the at least one mesa. At least one unoxidized aperture is preferably limited by at least four oxidation fronts.

A plurality of blind holes may be etched inside the layer stack in an area which will belong to the at least one mesa.

The blind holes are preferably arranged in a lattice-like way forming a grid having a first grid spacing in a first direction and a second grid spacing in a second different direction.

The first grid spacing and the second grid spacing may be identical, for instance in order to generate symmetrical apertures in view of an emission of polarization independent radiation.

Alternatively, the first grid spacing may be between 10% and 30% larger than the second grid spacing, for instance in order to generate asymmetrical apertures in view of an emission of polarization dependent radiation.

According to a preferred embodiment, a 3×3 grid having nine blind holes or a 4×4 grid having sixteen blind holes is formed per radiation emitter.

The oxidation may be carried out using processing parameters causing circular oxidation fronts, for instance in order to generate symmetrical apertures in view of an emission of polarization independent radiation.

Alternatively, the oxidation may be carried out using processing parameters causing anisotropic (e. g. elliptical) oxidation fronts, for instance in order to generate asymmetrical apertures in view of an emission of polarization dependent radiation.

The oxidized material of the oxidizable layer or layers is preferably electrically non-conductive.

Said step of fabricating the layer stack may include forming two or more oxidizable layers inside the layer stack.

The at least one oxidizable layer or at least one of the oxidizable layers may be formed between the first reflector and the active layer.

The at least one oxidizable layer or at least one of the oxidizable layers may be formed inside the first reflector.

The at least one oxidizable layer or at least one of the oxidizable layers may be formed between the second reflector and the active layer.

The at least one oxidizable layer or at least one of the oxidizable layers may be formed inside the second reflector.

In a preferred embodiment, at least one of the oxidizable layers is formed inside the first reflector or between the first reflector and the active layer and at least one of the oxidizable layers is formed inside the second reflector or between the second reflector and the active layer.

In another preferred embodiment, at least two oxidizable layers are formed inside the first reflector or between the first reflector and the active layer and/or at least two oxidizable layers are formed inside the second reflector or between the second reflector and the active layer.

The method described above is preferably carried out in a wafer-scale fashion wherein a plurality of mesas (and therefore emitters), which each comprise a plurality of apertures, is fabricated simultaneously.

Another exemplary embodiment of the present invention relates to a radiation emitter (for instance a VCSEL) comprising a layer stack having a first reflector, an active region, at least one aperture formed by unoxidized material of an oxidizable layer that is partly oxidized and partly unoxidized, and a second reflector;

wherein a mesa of the emitter includes at least the first reflector, the active region, the oxidizable layer, and the second reflector, characterized in that the mesa further comprises at least three blind holes which vertically extend to oxidized sections of the oxidizable layer, wherein the at least one aperture is limited by oxidation fronts of at least three oxidized sections, and wherein each of the blind holes forms a center point of one of the oxidation fronts.

The blind holes are preferably filled with a conducting material or at least the sidewalls of the holes are covered with the conducting material. The conducting material is preferably thermally conductive in order to dissipate heat that is generated during the operation of the radiation emitter.

The conducting material may also be electrically conductive, for instance in order to bypass electrical current.

The sidewalls of the blind holes and the conducting material or at least a section thereof may form an ohmic contact with the layer stack.

The conducting material or at least a section thereof may be isolated from the sidewalls of the blind holes and/or the bottom of the blind holes by an intermediate isolating layer, for instance to block a bypass of electrical current.

The at least one aperture or at least one of the apertures may be subjected to electrical current flow as well as optical radiation when the radiation emitter operates.

The conducting material may form an electrical bypass with respect to at least one of the apertures. Each bypassed aperture is subjected to optical radiation, only, because electrical current bypasses the bypassed aperture via the corresponding bypass.

Two or more apertures may be located inside the second reflector and/or between the active region and the second reflector.

At least the aperture that is the most adjacent to the active region, may be subjected to electrical current flow as well as optical radiation when the radiation emitter operates, wherein at least one of the remaining apertures may be bypassed.

BRIEF DESCRIPTION OF THE DRAWINGS

In order that the manner, in which the above-recited and other advantages of the invention are obtained, will be readily understood, a more particular description of the invention briefly described above will be rendered by reference to specific embodiments thereof, which are illustrated in the appended figures. Understanding that these figures depict only typical embodiments of the invention and are therefore not to be considered limiting of its scope, the invention will be described and explained with additional specificity and detail by the use of the accompanying drawings in which FIGS. 1-12 illustrate method steps for fabricating an exemplary embodiment of a radiation emitter in the form of a VCSEL.

DETAILED DESCRIPTION OF THE PREFERRED EMBODIMENTS

The preferred embodiments of the present invention will be best understood by reference to the drawings, wherein identical or comparable parts are designated by the same reference signs throughout.

It will be readily understood that the parameters of the embodiments of the present invention, as generally described herein, could vary in a wide range. Thus, the following more detailed description of exemplary embodiments of the present invention, is not intended to limit the scope of the invention but is merely representative of presently preferred embodiments of the invention.

FIGS. 1-12 show method steps for fabricating an exemplary embodiment of a radiation emitter in the form of a VCSEL 100 (see FIG. 7).

Figure 1:
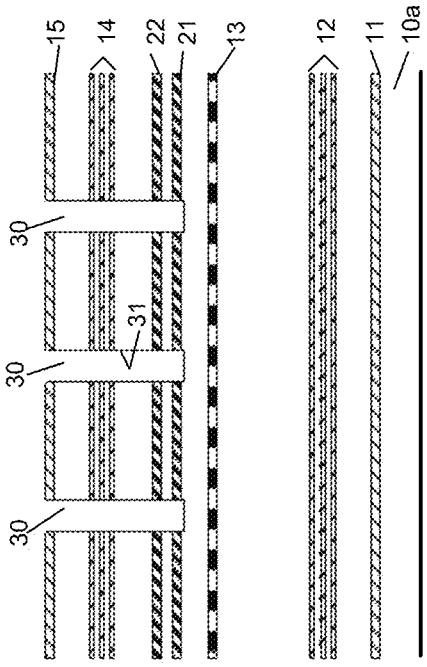

FIG. 1 shows a cross-section of an exemplary layer stack 10 that comprises a first (lower) contact layer 11, a first reflector 12, an active region 13, a first (lower) oxidizable layer 21, a second (upper) oxidizable layer 22, a second reflector 14, and a second (top) contact layer 15.

The first contact layer 11 is preferably highly p-doped (doping level >$10^{19}$ cm$^{-3}$). The second contact layer 15 is preferably highly n-doped (doping level >$10^{19}$ cm$^{-3}$).

The first and second reflectors 12 and 14 may be distributed Bragg reflectors (DBRs) that each comprise a plurality of reflector layers with alternating reflective indices.

The layer stack 10 is preferably fabricated by depositing semiconductor material such as AlGaAs on a substrate 10a.

In the exemplary embodiment of FIG. 1, the two oxidizable layers 21-22 are located above the active region 13.

Figure 2:
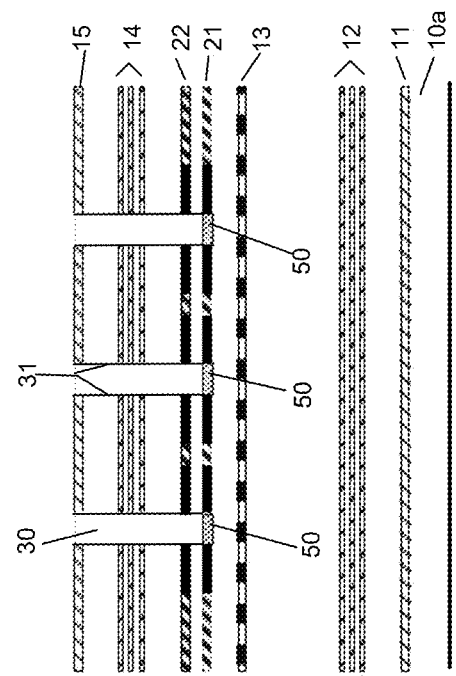

FIG. 2 shows the layer stack 10 of FIG. 1 after vertically etching blind holes 30 inside the layer stack 10. The blind holes 30 vertically protrude to the oxidizable layers 21-22 and expose the oxidizable layers 21-22.

Figure 3:
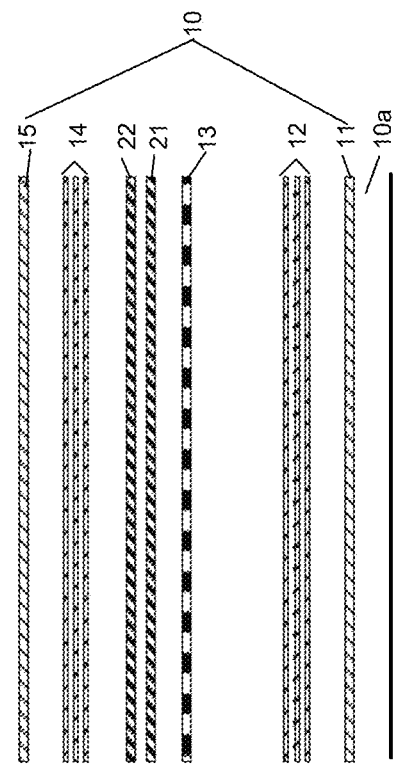

FIG. 3 shows the layer stack 10 of FIG. 2 after oxidizing the oxidizable layers 21-22 via the sidewalls 31 of the blind holes 30 in lateral direction. From each blind hole 30, an oxidation front radially (see arrow R) moves outwards during the oxidation. The step of etching is terminated before the entire oxidizable layers 21-22 are oxidized in order to form unoxidized apertures 40. Each unoxidized aperture 40 is limited by at least three oxidation fronts of oxidized layer material 20. The oxidized layer material 20 is preferably electrically isolating.

Figure 4:
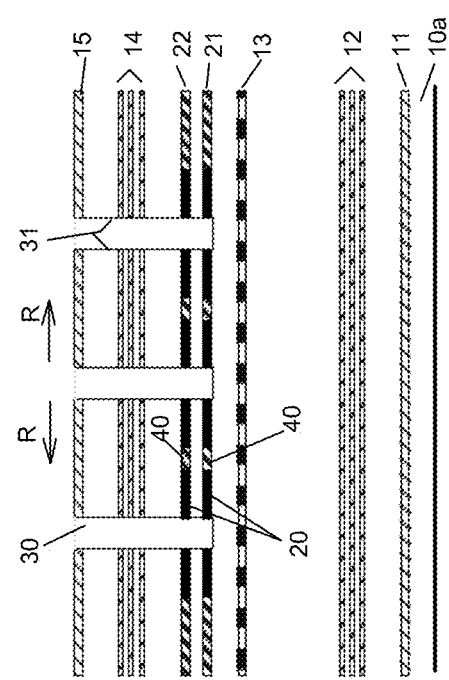

FIG. 4 shows the layer stack 10 of FIG. 3 after depositing an intermediate isolating layer 50 on the bottom and the lower section of the blind holes 30. The intermediate isolating layer 50 covers the edges of the oxidized layer material 20 of the first oxidizable layer 21.

FIG. 5 shows the layer stack 10 of FIG. 4 after filling the blind holes 30 with a first conducting material 61. The first conducting material 61 is preferably electrically and thermally conductive. The conducting material 61 is preferably Gold, Platinum, Titanium, Nickel, Gold-Germanium alloy or a sequence of these materials, depending on the doping type of the semiconductor material that is to be contacted.

In the embodiment of FIG. 5, the first conducting material 61 forms an ohmic contact with the uncovered sidewalls 31 of the blind holes 30.

Since the intermediate isolating layer 50 does not cover the edges of the oxidized layer material 20 of the second oxidizable layer 22, the apertures 40 formed in the second oxidizable layer 22 are electrically bypassed. This means that electrical current that is applied during the operation of the resulting radiation emitter 100 (see FIG. 7) after completing the fabrication, may flow from the surface of the layer stack 10 through the conducting material 61 into the layer or layers that are located between the first and second oxidizable layers 21-22.

Since the intermediate isolating layer 50 covers the edges of the oxidized layer material 20 of the first oxidizable layer 21, the apertures 40 formed in the first oxidizable layer 21 are not electrically bypassed. This means that electrical current is forced to pass the apertures 40 that are located in the first oxidizable layer 21.

In addition to its electrical influence, the first conducting material 61 preferably forms a heat sink that dissipates heat during the operation of the resulting radiation emitter 100.

The conducting material 61 may partly cover the surface of the second contact layer 15. However, sections 15a of the second contact layer 15 above the apertures 40 are preferably left uncovered in order to allow optical radiation P to exit the radiation emitter 100 without additional attenuation.

FIG. 6 shows the layer stack 10 of FIG. 5 after etching a mesa M inside the layer stack 10. The mesa M may have one or more steps SS. The mesa M preferably extends to the first contact layer 11 in order to allow depositing a second conductive material 62 and thereby contacting the first contact layer 11.

FIG. 7 shows the layer stack 10 of FIG. 6 after depositing the second conductive material 62 and contacting the first contact layer 11. The layer stack 10 of FIG. 7 provides a radiation emitter in the form of a VCSEL 100.

When applying an electrical voltage between the first and second conducting material 61 and 62, electrical current will flow through the apertures 40 of the first oxidizable layer 21 and the active region 13. The active region 13 generates optical radiation P that exits the radiation emitter 100 through the surface sections 15a of the second contact layer 15 that is uncovered by the first conductive material 61.

Each of the apertures 40 in combination with the adjacent section of the active region 13 may be regarded as an individual VCSEL unit within the radiation emitter 100 that comprises a plurality of these individual VCSEL units.

FIG. 8 shows a top view of the layer stack 10 of FIG. 2. after etching the blind holes 30. The blind holes 30 are preferably arranged in a lattice-like way forming a grid having a first grid spacing d1 in a first direction D1 and a second grid spacing d2 in a second different direction D2.

In one preferably embodiment, the first grid spacing d1 and the second grid spacing d2 are identical. In another preferably embodiment, the first grid spacing d1 is between 10% and 30% larger than the second grid spacing d2.

The first and second direction D1, D2 can be perpendicular. Alternatively, the first and second direction D1, D2 may be angled, preferably with an angle between 60° and 85°.

Figure 9:
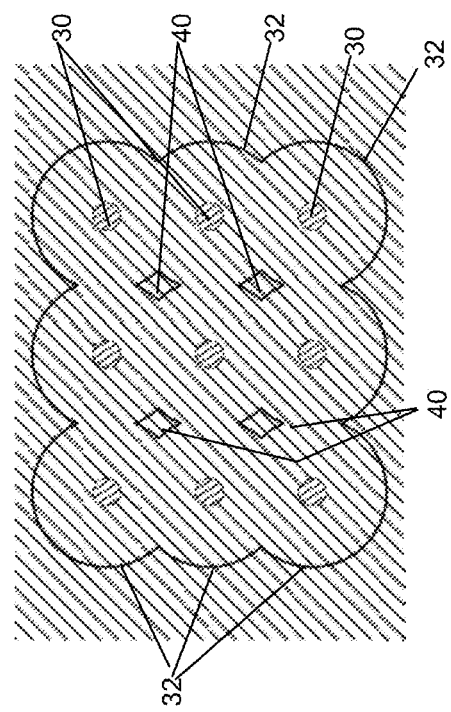

FIG. 9 shows a top view of the layer stack 10 of FIG. 3 after oxidizing the oxidizable layers 21-22. From each blind hole 30, an oxidation front 32 radially moves outwards during the oxidation. Each unoxidized aperture 40 is limited by four oxidation fronts 32 of oxidized layer material 20 and therefore has a diamond-like shape.

Figure 10:
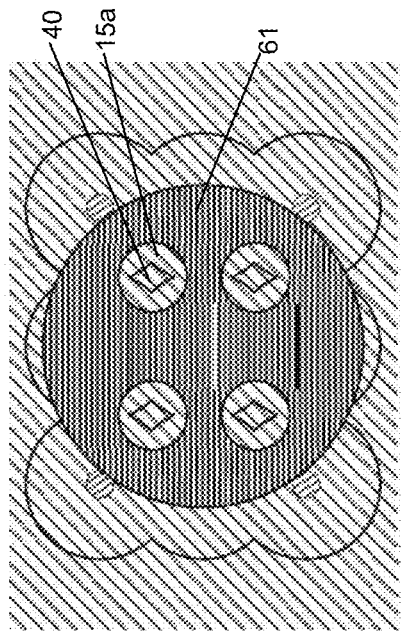

FIG. 10 shows a top view of the layer stack 10 of FIG. 5 after filling the blind holes 30 with the first conductive material 61. Sections 15a of the second contact layer 15 above the apertures 40 are left uncovered in order to allow the optical radiation P to exit the radiation emitter 100.

Figure 11:
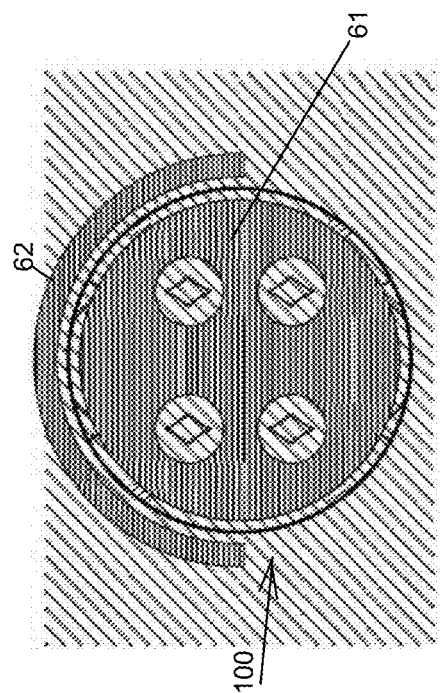

FIG. 11 shows a top view of the layer stack 10 of FIG. 7, i.e. the resulting radiation emitter 100 after contacting the first contact layer 11 by depositing the second conductive material 62.

FIGS. 12-18 show method steps for fabricating another exemplary embodiment of a radiation emitter in the form of a VCSEL 100.

Figure 12:
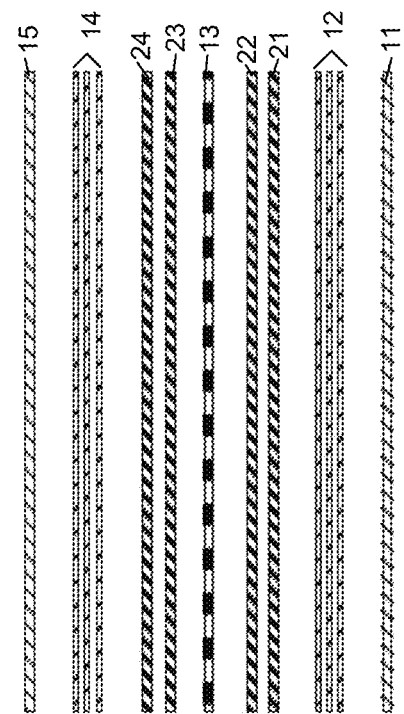

FIG. 12 shows a cross-section of an exemplary layer stack 10 that comprises four oxidizable layers 21-24. Two oxidizable layers 21-22 are located below the active region 13, and two oxidizable layers 23-24 are located above the active region 13.

Figure 13:
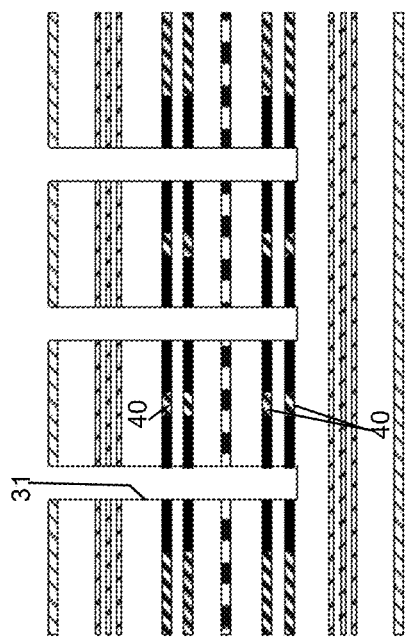
FIGS. 13-18 illustrate method steps for fabricating another exemplary embodiment of a radiation emitter in the form of a VCSEL.

FIG. 13 shows the layer stack 10 of FIG. 1 after vertically etching blind holes 30 inside the layer stack 10. The blind holes 30 vertically extend to the lowest oxidizable layer 21 and expose all of the oxidizable layers 21-24.

Figure 14:
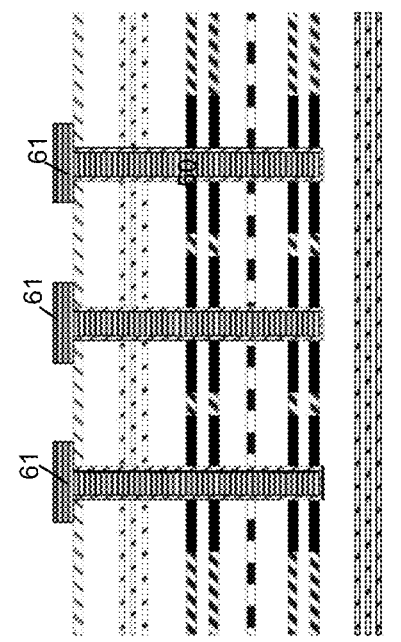

FIG. 14 shows the layer stack 10 of FIG. 13 after oxidizing the oxidizable layers 21-24 via the sidewalls 31 of the blind holes 30 in lateral direction. From each hole, an oxidation front radially moves outwards during the oxidation. The step of etching is terminated before the entire oxidizable layer is oxidized in order to form unoxidized apertures 40. Each unoxidized aperture 40 is limited by at least three oxidation fronts of oxidized layer material.

Figure 15:
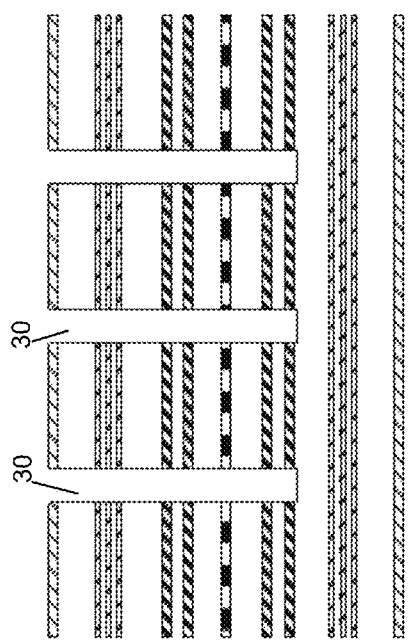

FIG. 15 shows the layer stack 10 of FIG. 14 after depositing an intermediate isolating layer 50 on the bottom and the entire sidewalls 31 of the blind holes 30.

Figure 16:
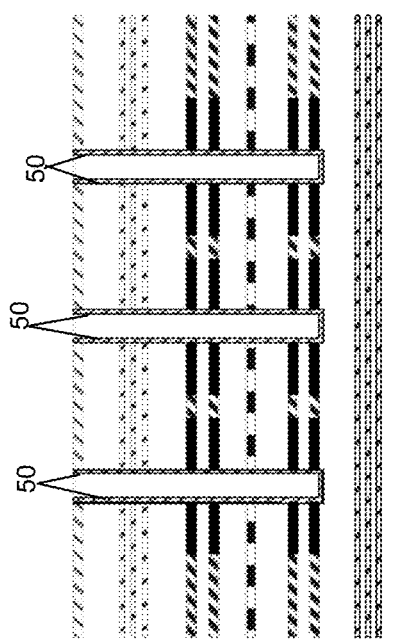

FIG. 16 shows the layer stack 10 of FIG. 15 after filling the blind holes 30 with a first conducting material 61. The conducting material 61 is preferably electrically and thermally conductive. The conducting material 61 is preferably Gold, Platinum, Titanium, Nickel, Gold-Germanium alloy or a sequence of these materials, depending on the doping type of the semiconductor material that is to be contacted.

Since the intermediate isolating layer 50 covers the sidewalls 31 of the blind holes 30, none of the apertures 40 is electrically bypassed. This means that electrical current that is applied during the operation of the resulting radiation emitter 100 after completing the fabrication, flows through all of the apertures 40.

Figure 17:
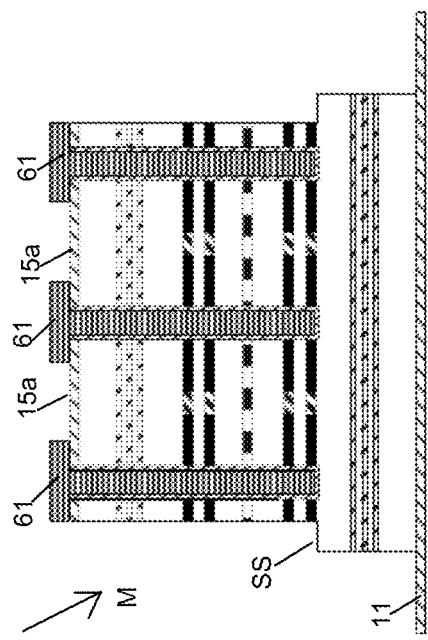

FIG. 17 shows the layer stack 10 of FIG. 16 after etching a mesa M inside the layer stack 10. The mesa M may have one or more steps SS. The mesa M preferably extends to the first contact layer 11 in order to allow depositing a second conductive material 62 and contacting the first contact layer 11.

Figure 18:
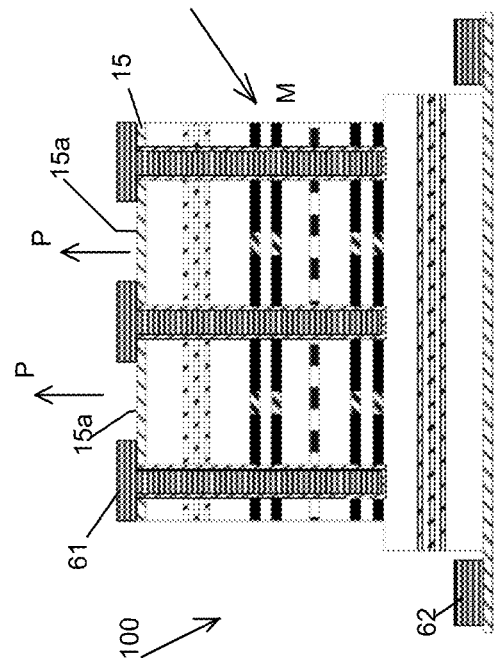

FIG. 18 shows the layer stack 10 of FIG. 17 after depositing the second conductive material 62 and contacting the first contact layer 11. The layer stack 10 of FIG. 18 provides a radiation emitter in the form of a VCSEL 100.

When applying an electrical voltage between the first and second conducting material 61,62, electrical current will flow through the apertures 40 of all oxidizable layers 21-22. The active region 13 generates optical radiation that exits the radiation emitter 100 through the surface sections 15a of the second conducting layer 15 that is uncovered by the first conductive material 61. Each of the apertures 40 in combination with the adjacent section of the active region 13 may be regarded as an individual VCSEL unit within the radiation emitter 100 that comprises a plurality of these individual VCSEL units.

In summary the exemplary embodiments described above relate to a method for fabricating a vertical-cavity surface-emitting laser (VCSEL) as radiation emitter 100 with multiple apertures 40 narrowly spaced in a single mesa M that result in single mode emission together with large optical output power and small electrical resistance. The fabrication of the VCSEL 100 may be based on etching of narrow holes 30, e.g. 5 µm or less, in a regular array of a few µm distance between each hole into VCSEL wafers containing for instance AlGaAs (preferentially about 98% Al-contents) aperture layers. The arrangement of the holes 30 with respect to each other is variable and application dependent. The oxidation of the e.g. AlO apertures 40 is progressing from the inside of the holes 30. The orientation of the axes of the hole-arrays can be varied with respect to the crystal axes, thus leading to self-limiting orientation dependent oxidation processes. The novel VCSEL properties, including defined polarization, enable data transmission across large fiber distances ~1 km and more, as well as dense wavelength division multiplexing (≤15 nm spacing). In addition, impedance matching of laser and driver circuits is eased due to the reduced impedance of the invention.

The exemplary embodiments of the invention described above may have one or more of the following features and/or advantages:

Exemplary embodiments of the invention may relate to a method for fabricating a vertical-cavity surface-emitting laser (VCSEL) with multiple apertures narrowly spaced in a single mesa M that result in single mode emission together with large optical output power and small electrical resistance.

Exemplary embodiments of the invention may consist of an active region sandwiched between two distributed Bragg reflectors (DBRs) and at least one oxid layer like a "normal" VCSEL structure. Any presently existing epi structure for high-speed oxide confined VCSELs can be used for the inventive approach. In contrast to presently employed VCSEL processing, the oxidation process may be based on etching holes of any shape into the wafer surface, exposing the oxide layer(s). These holes are serving as starting point for the lateral oxidation process.

The speed of the wet oxidation of the oxidizable layer(s) 21-24 may depend on Al-contents, AlGaAs layer thickness, and most importantly on the crystallographic direction. In addition it is controlled by temperature, total pressure and water partial pressure.

The arrangement of the etched holes in respect to each other and to the crystal axes, the distances between them, and finally the choice of the oxidation parameters impacts the shape of the resulting apertures and opens up new design roads. The oxidation fronts may be circular or elliptical. The resulting apertures may have a diamond shape.

The final processing step may comprise mesa M etching, n-contact deposition, and planarization based on the processing steps developed for "normal" VCSELs.

GaAs/AlAs heterostructures are enabling the growth of lattice matched DBRs and high Al-content layers suitable for wet oxidation and leading to current and optical field confinement. The apertures will not be oxidized from the outside after etching a mesa M, but from the inside of holes, being first of all etched in regular arrays.

The arrangement of the blind holes with respect to each other and to the crystal axes presents a free design parameter. The resulting apertures however may have always the same size. A difference in distance of the holes in one direction and the other direction may lead to a difference in oxide diameter in both directions and may allow polarized emission if desired.

The oxidation speed depends on the crystal axes. The impact on the shape of the oxidation front has an impact on the shape of the resulting apertures.

The alignment between the series of holes defined by the mask and the crystal axes may enable a shape optimization of the oxide confined apertures and allows to control the polarization status of the emitted light.

The distances between the holes (d1 in one direction and d2 in the other direction) and the size of the holes can be chosen to position a sufficient number of apertures so close to each other, that additionally the emitted light emission can be coupled into the 50 or 62.5 μm core of a multimode fiber (MMF) preferably without coupling optics.

The optical power increases linearly with the number of apertures. If the size of the apertures is chosen in such a way that the laser emits single mode light, it intensity increases with the number of apertures, showing identical wavelength, polarization and transversal mode. The electrical resistance decreases similarly with the number of apertures. The total resistance Rt can be calculated by $$\frac{1}{R_t} = \sum_{x=1}^{n} \frac{1}{R_x}$$

With the resistance Rx of an individual aperture.

The various embodiments and aspects of embodiments of the invention disclosed herein are to be understood not only in the order and context specifically described in this specification, but to include any order and any combination thereof. Whenever the context requires, all words used in the singular number shall be deemed to include the plural and vice versa. Whenever the context requires, all options that are listed with the word "and" shall be deemed to include the word "or" and vice versa, and any combination thereof.

In the drawings and specification, there have been disclosed a plurality of embodiments of the present invention. The applicant would like to emphasize that each feature of each embodiment may be combined with or added to any other of the embodiments in order to modify the respective embodiment and create additional embodiments. These additional embodiments form a part of the present disclosure and, therefore, the applicant may file further patent claims regarding these additional embodiments at a later stage of the prosecution.

Further, the applicant would like to emphasize that each feature of each of the following dependent claims may be combined with any of the present independent claims as well as with any other (one ore more) of the present dependent claims (regardless of the present claim structure). Therefore, the applicant may direct further patent claims towards other claim combinations at a later stage of the prosecution.

The invention claimed is:

1. Radiation emitter (100) comprising
   a layer stack (10) having a first reflector (12), an active region (13), at least one aperture (40) formed by unoxidized material (20) of an oxidizable layer (21-24) that is partly oxidized and partly unoxidized, and a second reflector (14);
   wherein a mesa (M) of the emitter (100) includes at least the first reflector (12), the active region (13), the oxidizable layer (21-24), and the secondreflector (14), characterized in that
   the mesa (M) further comprises at least three blind holes (30) which vertically extend to oxidized sections of the oxidizable layer (21-24),
   wherein the at least one aperture (40) is limited by oxidation fronts (32) of at least three oxidized sections,
   wherein each of the blind holes (30) forms a center point of one of the oxidation fronts (32),
   wherein the blind holes (30) are filled with a conducting material (61) or at least the sidewalls (31) of the holes (30) are covered with the conducting material (61);
   wherein the sidewalls (31) of the blind holes (30) and the conducting material (61) or at least a section thereof form an ohmic contact with the layer stack (10); and
   wherein the conducting material (61) is isolated from the bottom of the blind holes (30) by an intermediate isolating layer (50).

2. Radiation emitter (100) of claim 1 wherein
   the at least one aperture (40) or at least one of the apertures (40) is subjected to electrical current flow as well as optical radiation (P) when the radiation emitter (100) operates.

3. Radiation emitter (100) of claim 1
   wherein the conducting material forms an electrical bypass with respect to at least one of the apertures (40), and
   wherein each bypassed aperture (40) is subjected to optical radiation (P), only, because electrical current bypasses the bypassed aperture (40) via the corresponding bypass.

4. Radiation emitter (100) of claim 3
   wherein two or more apertures (40) are vertically stacked with respect to each other and are located above the active region (13);
   wherein at least the aperture (40) that is the most adjacent to the active region (13), is subjected to electrical current flow as well as optical radiation (P) when the radiation emitter (100) operates, and
   wherein at least one of the remaining apertures (40) is bypassed.

* * * * *